United States Patent
Takemoto et al.

(10) Patent No.: US 11,699,612 B2
(45) Date of Patent: Jul. 11, 2023

(54) SUBSTRATE FIXING DEVICE, ELECTROSTATIC CHUCK AND ELECTROSTATIC CHUCK MANUFACTURING METHOD

(71) Applicant: SHINKO ELECTRIC INDUSTRIES CO., LTD., Nagano (JP)

(72) Inventors: Keiichi Takemoto, Nagano (JP); Yoichi Harayama, Nagano (JP); Hiroyuki Asakawa, Nagano (JP); Takahiro Rokugawa, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 77 days.

(21) Appl. No.: 17/524,322

(22) Filed: Nov. 11, 2021

(65) Prior Publication Data

US 2022/0157636 A1   May 19, 2022

(30) Foreign Application Priority Data

Nov. 13, 2020 (JP) .................... 2020-189771
Apr. 13, 2021 (JP) .................... 2021-067843

(51) Int. Cl.
*H01T 23/00* (2006.01)
*H01L 21/683* (2006.01)
*H01L 21/67* (2006.01)
*H01L 21/687* (2006.01)

(52) U.S. Cl.
CPC .... *H01L 21/6833* (2013.01); *H01L 21/67248* (2013.01); *H01L 21/68757* (2013.01)

(58) Field of Classification Search
None
See application file for complete search history.

(56) References Cited

U.S. PATENT DOCUMENTS 5,688,331 A * 11/1997 Aruga ................... C23C 16/46
                                                                118/728
5,777,838 A *  7/1998 Tamagawa .......... H01L 21/6875
                                                                279/128
2006/0098379 A1* 5/2006 Otaka ................. H01L 21/6831
                                                                361/234

(Continued)

FOREIGN PATENT DOCUMENTS

JP    2014-112672    6/2014
JP    2016-100474    5/2016

(Continued)

*Primary Examiner* — Stephen W Jackson
(74) *Attorney, Agent, or Firm* — Rankin, Hill & Clark LLP (57) ABSTRACT

A substrate fixing device includes: a base plate; and an electrostatic chuck that is fixed to the base plate to adsorb a substrate by electrostatic force. The electrostatic chuck includes: an adsorption layer that is formed of ceramic and that contacts the substrate to adsorb and hold the substrate; a first heating layer that is formed on the adsorption layer and that includes a first electrode; a second heating layer that is formed on the first heating layer and that includes a second electrode; and a via that is provided between the first electrode and the second electrode to electrically connect the first electrode and the second electrode to each other. The via includes a body portion, and an end portion that is connected to the body portion. A diameter of the end portion is larger than that of the body portion.

11 Claims, 10 Drawing Sheets

(56) References Cited

U.S. PATENT DOCUMENTS

| | | |
|---|---|---|
| 2014/0154819 A1 | 6/2014 | Gaff et al. |
| 2017/0309510 A1 | 10/2017 | Maehata et al. |
| 2017/0345668 A1* | 11/2017 | Takebayashi ..... H01L 21/67248 |
| 2018/0047604 A1 | 2/2018 | Takemoto et al. |
| 2018/0294177 A1* | 10/2018 | Peng ........................ H01J 37/32 |
| 2018/0374763 A1 | 12/2018 | Gaff et al. |
| 2022/0013397 A1* | 1/2022 | Lee ................... H01L 21/67103 |

FOREIGN PATENT DOCUMENTS

| | | |
|---|---|---|
| JP | 2016-136611 | 7/2016 |
| JP | 2018-026427 | 2/2018 |

* cited by examiner

SUBSTRATE FIXING DEVICE, ELECTROSTATIC CHUCK AND ELECTROSTATIC CHUCK MANUFACTURING METHOD

This application claims priority from Japanese Patent Applications No. 2020-189771, filed on Nov. 13, 2020, and No. 2021-067843, filed on Apr. 13, 2021, the entire contents of which are herein incorporated by reference.

BACKGROUND

Technical Field

The present disclosure relates to a substrate fixing device, an electrostatic chuck, and an electrostatic chuck manufacturing method.

Background Art

An electrostatic chuck (ESC) is typically provided in a substrate fixing device which adsorbs and holds a wafer, for example, in order to manufacture semiconductor components. The electrostatic chuck is configured by a ceramic plate in which an electrode is built. The substrate fixing device has a structure in which the electrostatic chuck is fixed to a base plate. When a voltage is applied to the electrode built in the ceramic plate, the wafer is adsorbed to the electrostatic chuck by use of electrostatic force. Since the wafer is adsorbed to the electrostatic chuck so as to be held by the electrostatic chuck, processes such as microfabrication and etching can be efficiently performed on the wafer.

Such an electrostatic chuck may have a temperature regulation function to regulate temperature of the wafer. Specifically, for example, a heater electrode may be formed by screen-printing a paste of a metal such as tungsten, so that the heater electrode can be fired simultaneously when the ceramic plate is formed. In addition, in order to obtain high heat uniformity in a wafer mounting face, a technique has been also devised so that a rolled metal foil on an insulating resin is etched using photolithography to thereby form an external heater electrode (see e.g., JP-A-2016-136611, JP-A-2016-100474, JP-A-2014-112672, and JP-A-2018-26427).

With recent development of the microfabrication on the wafer, higher heat uniformity is also required of the electrostatic chuck that adsorbs the wafer. In other words, the electrostatic chuck is requested to be controlled at an equal temperature all over the adsorption face thereof.

Even when the external heater electrode that provides high heat uniformity is used, however, certain restrictions on the degree of freedom for arranging the heater electrode cause a problem of a temperature gradient occurring between heater zones. Specifically, for example, an area of the heater electrode becomes wider in a power feeding portion that supplies electric power to the heater electrode. Therefore, it is difficult to completely equalize the arrangement of the heater electrode, and there is a limit on an improvement of the heat uniformity all over the adsorption face of the electrostatic chuck.

SUMMARY

The present disclosure provides a substrate fixing device, an electrostatic chuck and an electrostatic chuck manufacturing method, which can obtain sufficiently high heat uniformity.

A certain embodiment provides a substrate fixing device.
The substrate fixing device comprises: a base plate; and an electrostatic chuck that is fixed to the base plate to adsorb a substrate by electrostatic force.
The electrostatic chuck comprises:
an adsorption layer that is formed of ceramic and that contacts the substrate to adsorb and hold the substrate;
a first heating layer that is formed on the adsorption layer and that includes a first electrode configured to generate heat;
a second heating layer that is formed on the first heating layer and that includes a second electrode configured to generate heat; and
a via that is provided between the first electrode and the second electrode to electrically connect the first electrode and the second electrode to each other;
The via comprises a body portion, and an end portion that is connected to the body portion.
The body portion penetrates at least one of the first electrode and the second electrode.
The end portion is formed on the at least one of the first electrode and the second electrode which the body portion penetrates.
A diameter of the end portion is larger than that of the body portion.

DETAILED DESCRIPTION

An embodiment of a substrate fixing device, an electrostatic chuck, and an electrostatic chuck manufacturing method disclosed by the present application will be described below in detail with reference to the drawings. Incidentally, the present invention is not limited by this embodiment.

Figure 1:
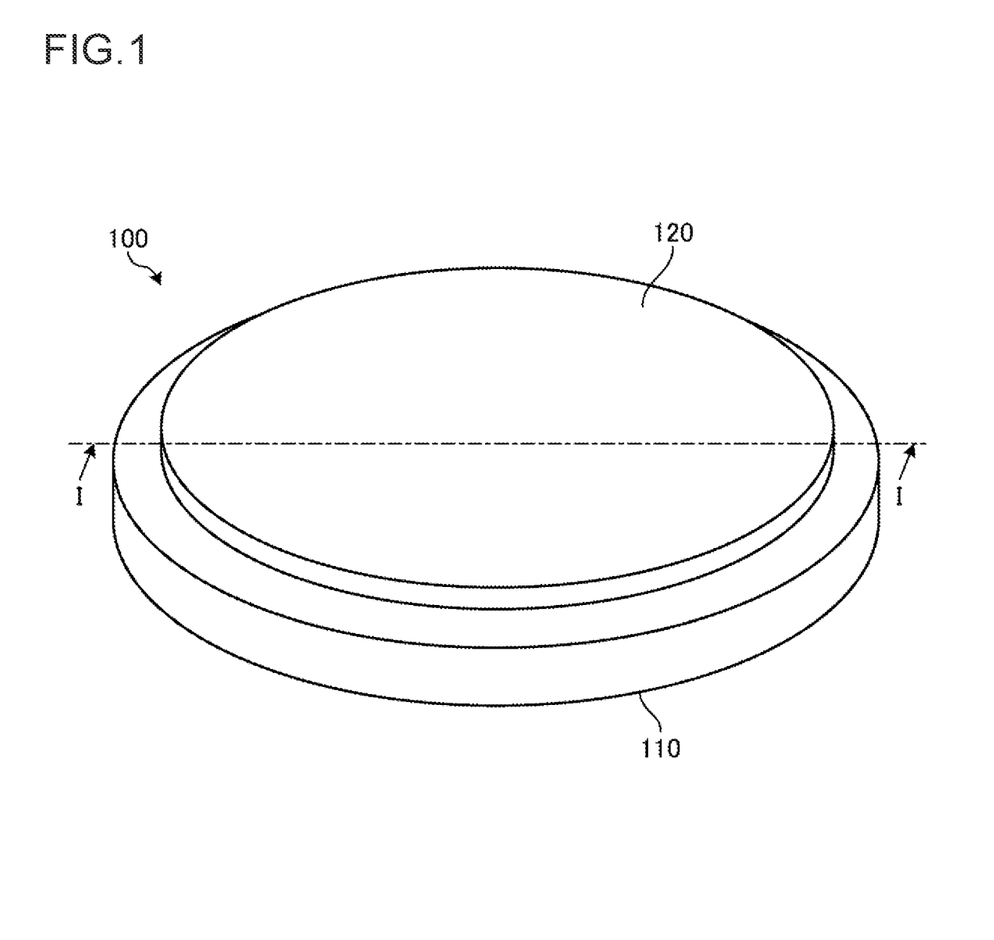
FIG. 1 is a perspective view illustrating a configuration of a substrate fixing device according to an embodiment.

FIG. 1 is a perspective view illustrating a configuration of a substrate fixing device 100 according to an embodiment. The substrate fixing device 100 shown in FIG. 1 has a structure in which an electrostatic chuck 120 is adhesively bonded to a base plate 110.

The base plate 110 is, for example, a circular member made of a metal such as aluminum. The base plate 110 is a base material for fixing the electrostatic chuck 120. The base plate 110 is, for example, attached to a semiconductor manufacturing apparatus or the like, so as to make the substrate fixing device 100 function as a semiconductor holding device for holding a wafer.

The electrostatic chuck 120 regulates temperature of an object such as a wafer while adsorbing the object by use of electrostatic power. That is, the electrostatic chuck 120 is formed in such a manner that a ceramic layer adsorbing the object is deposited on a heater layer heating the object. The electrostatic chuck 120 is smaller in diameter than the base plate 110, and fixed to the center of the base plate 110. On this occasion, the heater layer of the electrostatic chuck 120 is adhesively bonded to the base plate 110, so that the electrostatic chuck 120 is fixed to the base plate 110. The ceramic layer is deposited on an upper face of the heater layer to expose an adsorption face that adsorbs the object.

Figure 2:
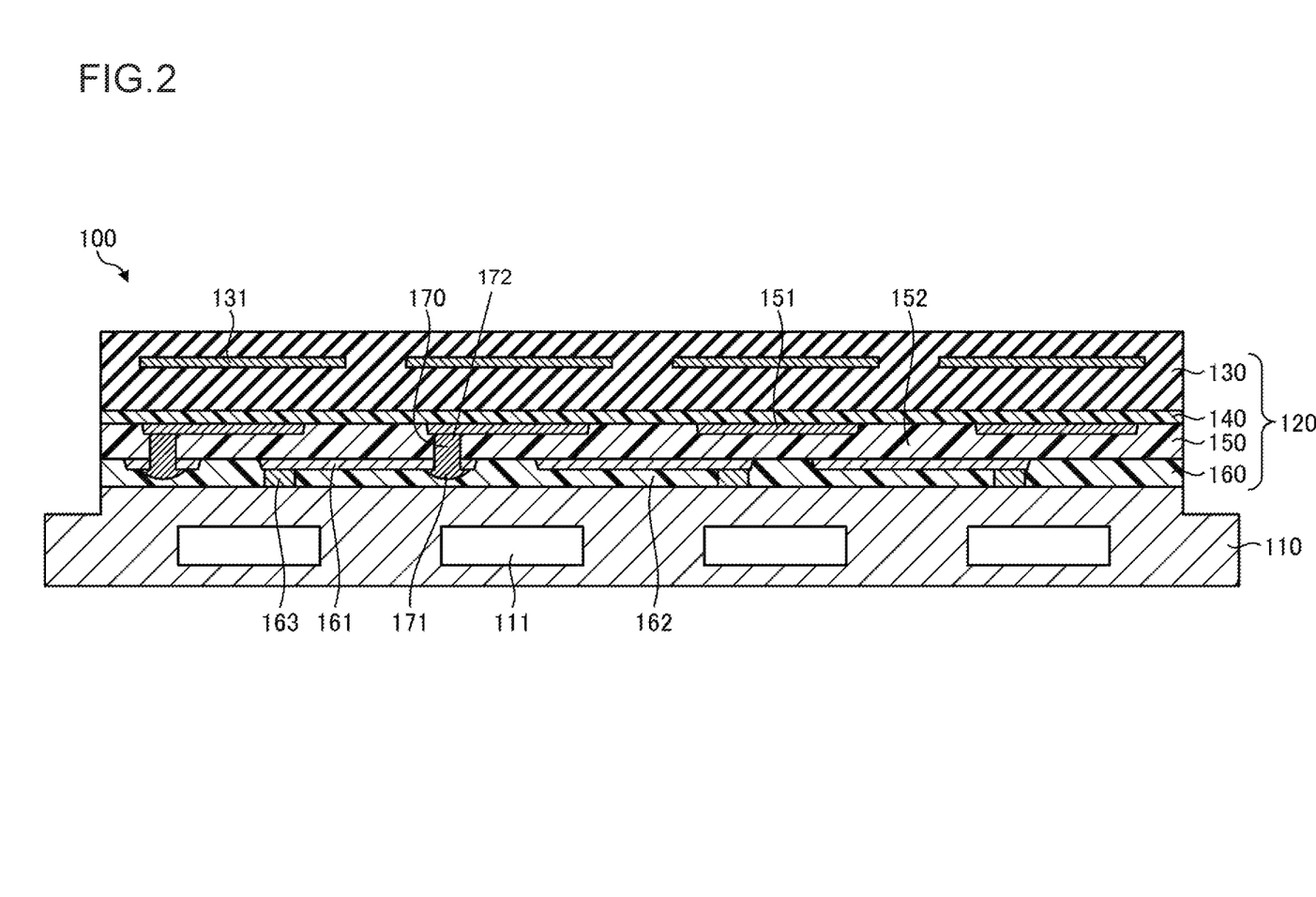
FIG. 2 is a schematic view illustrating a section of the substrate fixing device according to the embodiment.

FIG. 2 is a schematic view illustrating a section taken along a line I-I of FIG. 1. As shown in FIG. 2, the substrate fixing device 100 has a configuration in which the electrostatic chuck 120 is adhesively bonded to the base plate 110.

The base plate 110 is, for example, a metal member that is about 20 to 50 mm thick and inside which cooling water channels 111 serving as cooling water flow paths are provided. The base plate 110 cools the electrostatic chuck 120 by cooling water flowing into the cooling water channels 111 from the outside of the substrate fixing device 100. When the electrostatic chuck 120 is cooled, for example, the object such as the wafer adsorbed to the electrostatic chuck 120 is cooled.

Incidentally, the base plate 110 may have cooling gas channels serving as cooling gas flow paths, in place of the cooling water channels 111. In short, the base plate 110 is merely required to have, for example, refrigerant passages through which a refrigerant such as the cooling water or the cooling gas is made to pass.

The electrostatic chuck 120 has a ceramic layer 130, an insulating resin layer 140, a first heating layer 150, and a second heating layer 160. The second heating layer 160 is adhesively bonded to the base plate 110.

The ceramic layer 130 is a ceramic layer that is, for example, about 4.5 mm thick and inside which electrically conductive electrodes 131 are provided. The ceramic is obtained by firing green sheets made of, for example, aluminum oxide. When a voltage is applied to the electrodes 131 of the ceramic layer 130, the ceramic layer 130, for example, adsorbs the object such as the wafer by electrostatic force. In other words, in FIG. 2, an upper face of the ceramic layer 130 serves as an adsorption face, and the object is adsorbed to the adsorption face when the voltage is applied to the electrodes 131.

The insulating resin layer 140 that is deposited on the ceramic layer 130 is, for example, a layer made of an insulating resin having high thermal conductivity and high heat resistance, such as an epoxy resin or a bismaleimide-triazine resin. The insulating resin layer 140 is, for example, about 40 to 100 μm thick.

The first heating layer 150 that is deposited on the insulating resin layer 140 is a layer including heater electrodes 151, and an insulating resin 152 that covers the heater electrodes 151. The heater electrodes 151 that are formed on the surface of the insulating resin layer 140 generate heat when the voltage is applied to the heater electrodes 151. The heater electrodes 151 are covered with the insulating resin 152. Like the insulating resin layer 140, the insulating resin 152 is, for example, an insulating resin having high thermal conductivity and high heat resistance, such as an epoxy resin or a bismaleimide-triazine resin. The insulating resin 152 is, for example, about 40 to 300 μm thick.

The second heating layer 160 that is deposited on the first heating layer 150 is a layer including heater electrodes 161, an insulating resin 162 that covers the heater electrodes 161, and power feeding portions 163. The heater electrodes 161 that are formed on the surface of the insulating resin 152 constituting the first heating layer 150 generate heat when the voltage is applied to the heater electrodes 161. The heater electrodes 161 are covered with the insulating resin 162. Like the insulating resin layer 140 and the insulating resin 152, the insulating resin 162 is, for example, an insulating resin having high thermal conductivity and high heat resistance, such as an epoxy resin or a bismaleimide-triazine resin. The insulating resin 162 is, for example, about 40 to 300 μm thick. The power feeding portions 163 are electrically conductive members that supply electric power from the base plate 110 to the heater electrodes 161. That is, the power feeding portions 163 are electrically connected to the base plate 110 and the heater electrodes 161 to apply a voltage to the heater electrodes 161.

When the voltage is applied to the heater electrodes 151 of the first heating layer 150 and the heater electrodes 161 of the second heating layer 160, the heater electrodes 151 and 161 generate heat to heat the ceramic layer 130 and heat the object adsorbed to the ceramic layer 130. Then, the first heating layer 150 and the second heating layer 160 regulate temperature of the ceramic layer 130 by the heating with the heater electrodes 151 and 161 and the cooling through the base plate 110, so that the temperature of the object adsorbed to the ceramic layer 130 is regulated to be a desired temperature. Incidentally, instead of functioning as the heater electrodes generating heat, the heater electrodes 161 of the second heating layer 160 may function as bypass electrodes through which the heater electrodes 151 of the first heating layer 150 are electrically connected to each other or through which the heater electrodes 151 and the power feeding portions 163 are electrically connected to each other.

For example, an alloy such as CN49 (constantan) (an alloy of Cu/Ni/Mn/Fe), Zeranin (an alloy of Cu/Mn/Sn) or Manganin (an alloy of Cu/Mn/Ni) can be used as the material of the heater electrodes 151 and 161. In addition, in the case where the heater electrodes 161 function as the bypass electrodes, for example, copper or a copper alloy can be used as the material of the heater electrodes 161. Thicknesses of the heater electrodes 151 and 161 using these metals are, for example, about 25 to 50 μm to be included in the range of 15 to 200 μm.

Moreover, thermal conductivity of the insulating resin layer 140, the first heating layer 150, and the second heating layer 160 may be improved due to a filler of alumina, aluminum nitride, or the like, contained in the insulating resin layer 140, the insulating resin 152, and the insulating resin 162.

Each of vias 170 is formed in such a manner that an electrically conductive member such as a metal paste or a solder is filled into a via hole that penetrates the insulating resin 152 of the first heating layer 150 and the heater electrode 161 of the second heating layer 160. Thus, through the via 170, the heater electrode 151 of the first heating layer 150 and the heater electrode 161 of the second heating layer 160 are electrically connected to each other. Accordingly, when a voltage is applied to the heater electrode 161 from the power feeding portion 163, the voltage is also applied to the heater electrode 151 that is connected to the heater electrode 161 through the via 170. The via 170 has a body portion 172, and an end portion 171 that is connected to the body portion 172. The body portion 172 penetrates the insulating resin 152 and the heater electrode 161. The body portion 172 may have a tapered shape with a diameter decreasing as it goes from the heater electrode 161 to the heater electrode 151.

The diameter of the body portion 172 (i.e., the diameter of the via hole) is, for example, included in a range from 100 µm to 3 mm. Then, of the via 170, the end portion 171 on the surface of the heater electrode 161 is larger in diameter than the via hole to extend outward from the circumference of the via hole. Specifically, the end portion 171 extends outward by at least 50 µm or more from the outer circumference of the via hole. As a result, the end portion 171 securely contacts the surface of the heater electrode 161 so that connection reliability between the heater electrode 151 and the heater electrode 161 can be improved. Incidentally, thickness of the end portion 171 of the via 170 is, for example, included in a range of 50 to 300 µm, so as not to exceed thickness of the insulating resin 162. In other words, the end portion 171 is covered with the insulating resin 162.

Figure 3:
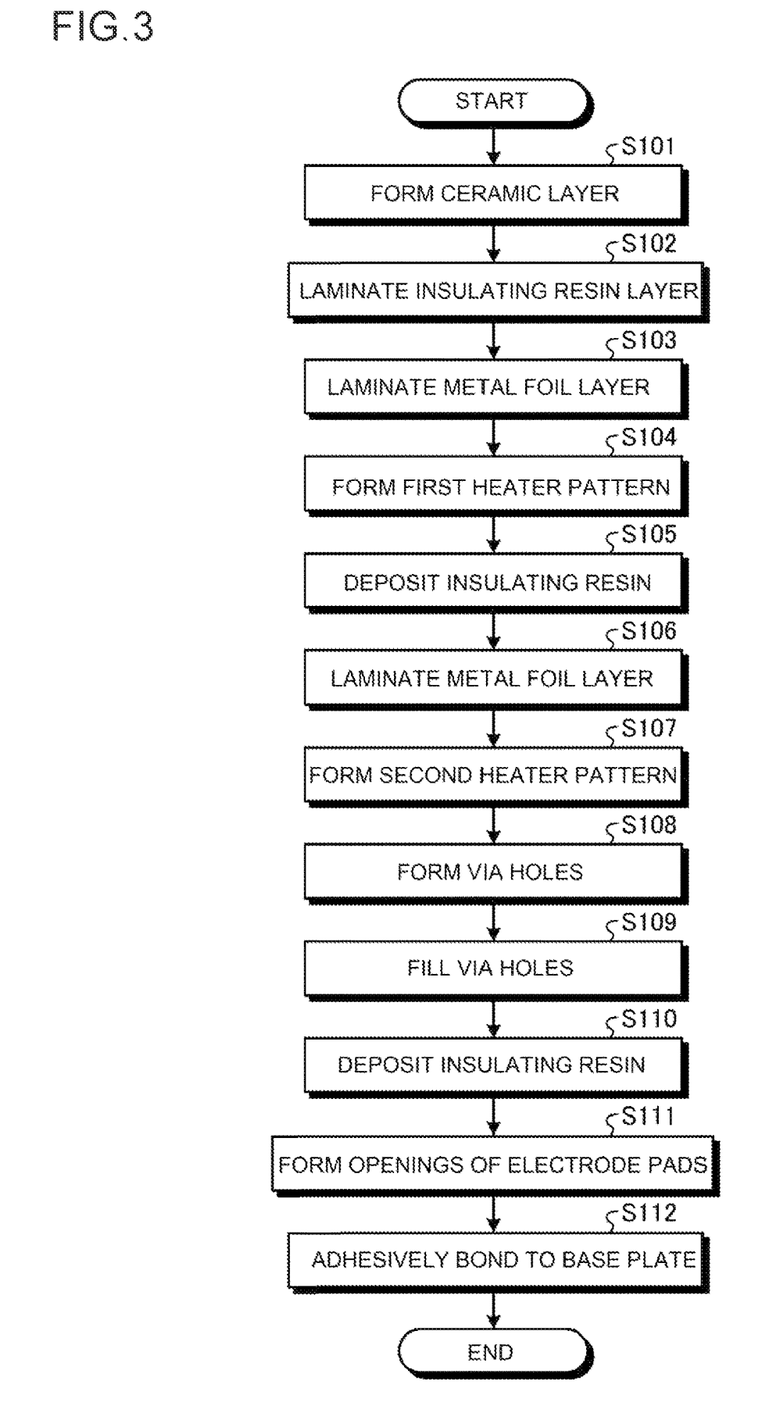
FIG. 3 is a flow chart illustrating a method for manufacturing the substrate fixing device according to the embodiment.

Next, a method for manufacturing the substrate fixing device 100 having the above configuration will be described with reference to a flow chart shown in FIG. 3.

Figure 4:
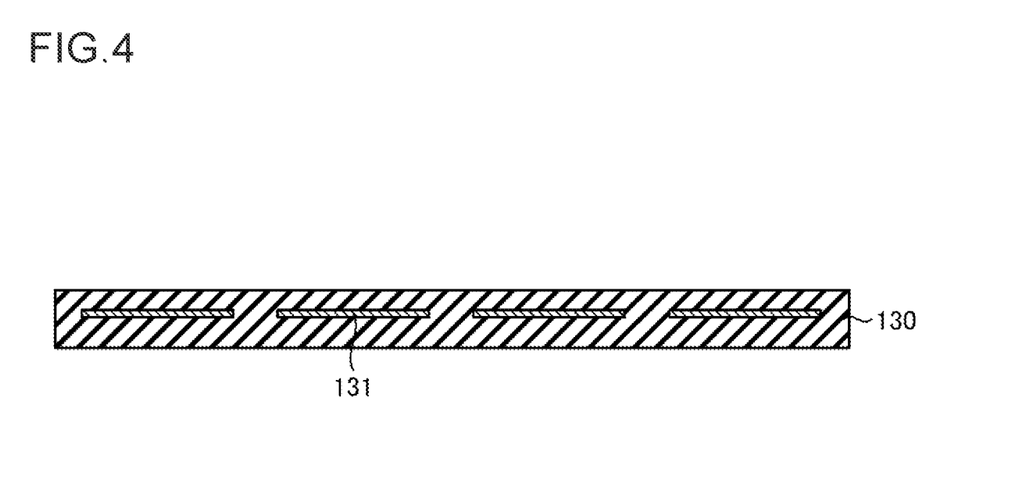
FIG. 4 is a view illustrating a specific example of a ceramic layer forming step.

First, a ceramic layer 130 adsorbing an object is formed (step S101). Specifically, for example, a plurality of green sheets made of aluminum oxide as a main material are produced, and electrodes 131 are formed on one face of the green sheets appropriately. The electrodes 131 can be formed, for example, by screen-printing a metal paste on the surface of the green sheets. Then, a plurality of green sheets are deposited and fired. Thus, the ceramic layer 130 is formed. A layer of the electrodes 131 is provided inside the ceramic layer 130, for example, as shown in FIG. 4.

Figure 5:
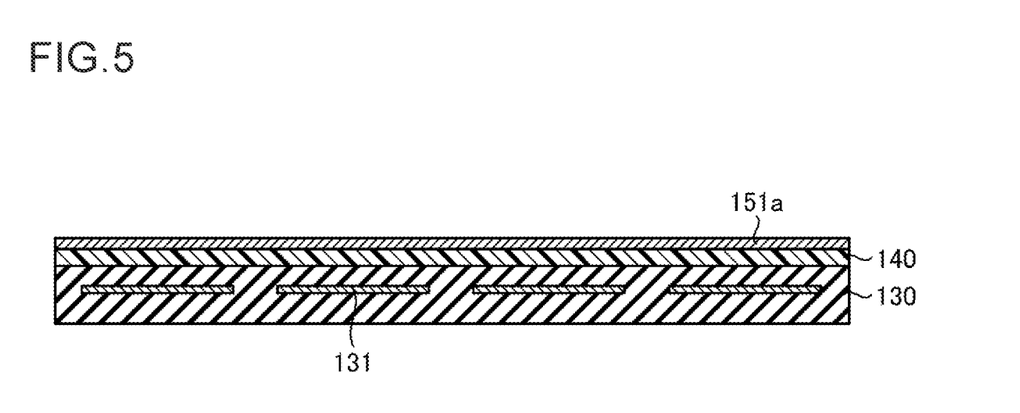
FIG. 5 is a view illustrating a specific example of a metal foil layer laminating step.

When the ceramic layer 130 is formed, an insulating resin layer 140 is laminated on the surface of the ceramic layer 130 (step S102). A metal foil layer that will serve as heater electrodes 151 of a first heating layer 150 is laminated on the surface of the insulating resin layer 140 (step S103). Specifically, for example, as shown in FIG. 5, the insulating resin layer 140 that is, for example, 40 to 100 µm thick is laminated on the surface of the ceramic layer 130, and a metal foil layer 151*a* that is, for example, 25 to 50 µm thick is laminated on the surface of the insulating resin layer 140. The insulating resin layer 140 and the metal foil layer 151*a* are closely bonded to the ceramic layer 130 by vacuum hot press bonding based on vacuum lamination and pressing.

The insulating resin layer 140 is, for example, formed of an insulating resin having high thermal conductivity and high heat resistance, such as an epoxy resin or a bismaleimide-triazine resin. In addition, the thermal conductivity may be improved, for example, due to a filler of alumina, aluminum nitride, or the like, contained in the insulating resin layer 140. On the other hand, a rolled alloy exemplified as the material of the heater electrodes 151 and 161 can be used as a material of the metal foil layer 151*a*. That is, examples of the metal foil layer 151*a* include alloys such as CN49 (constantan) (an alloy of Cu/Ni/Mn/Fe), Zeranin (an alloy of Cu/Mn/Sn) and Manganin (an alloy of Cu/Mn/Ni).

Figure 6:
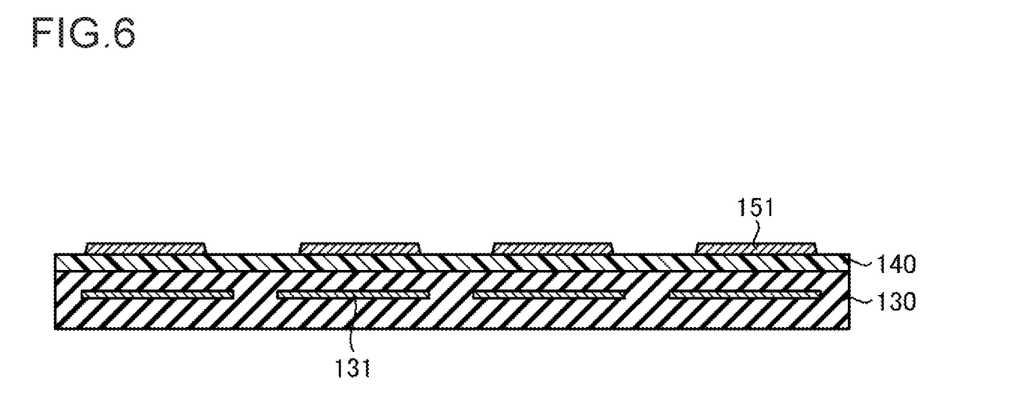
FIG. 6 is a view illustrating a specific example of a first heater pattern forming step.

Due to etching performed on the metal foil layer 151*a*, for example, using photolithography, a first heater pattern having a desired pattern is formed (step S104). That is, a resist is formed on an upper face of the metal foil layer 151*a*, and the resist is exposed to light and developed so as to form a resist pattern that covers portions to be left as the heater electrodes 151. Then, the metal foil layer 151*a* exposed without being covered with the resist pattern is removed by etching so that the heater electrodes 151 having the desired pattern are formed, for example, as shown in FIG. 6. In the example shown in FIG. 6, for example, the heater electrodes 151 having a double concentric circle pattern are formed.

Figure 7:
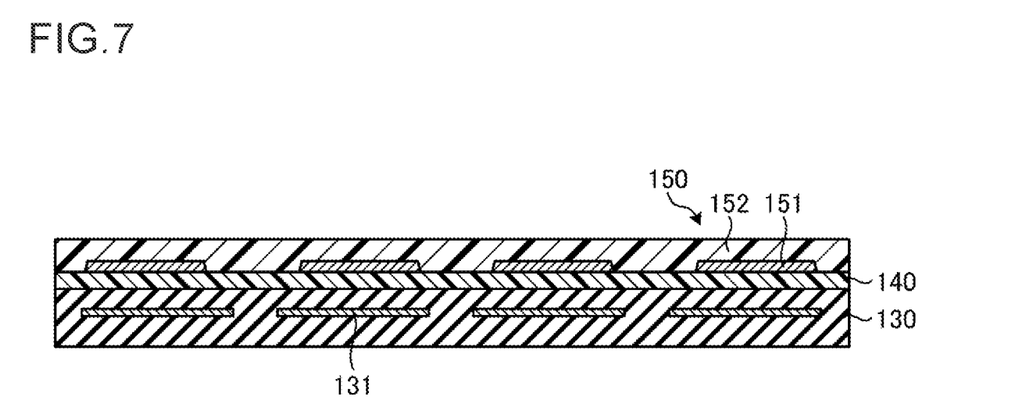
FIG. 7 is a view illustrating a specific example of an insulating resin forming step.

Then, an insulating resin 152 is deposited to cover the heater electrodes 151 (step S105). Specifically, the insulating resin 152 in a semi-cured state is deposited so as to cover the insulating resin layer 140 and the heater electrodes 151, and then heated and pressed. Thus, the insulating resin 152 covering the heater electrodes 151 is cured. As a result, the first heating layer 150 deposited on the insulating resin layer 140 is formed, for example, as shown in FIG. 7.

Figure 8:
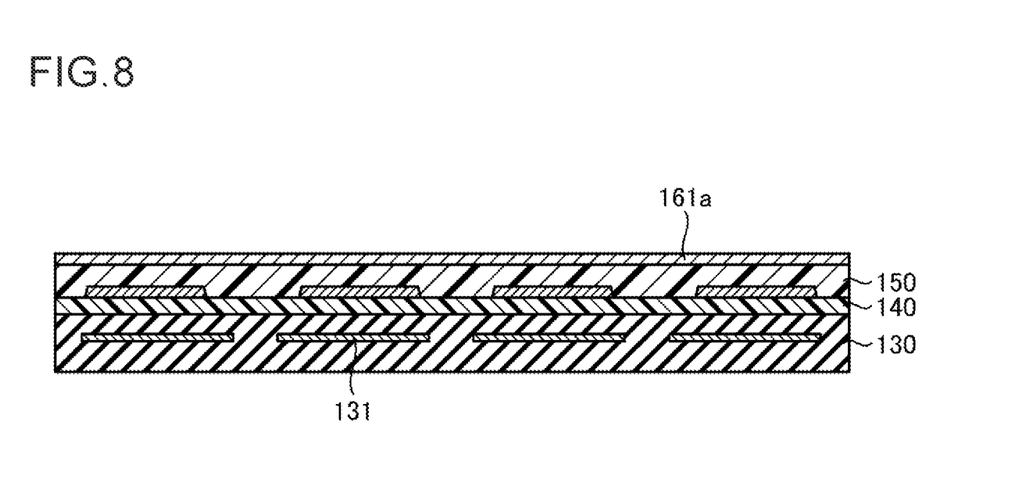
FIG. 8 is a view illustrating a specific example of another metal foil layer laminating step.

When the first heating layer 150 is formed, a metal foil layer that will serve as heater electrodes 161 of a second heating layer 160 is laminated on the surface of the insulating resin 152 constituting the first heating layer 150 (step S106). Specifically, the metal foil layer 161*a*, for example, 25 to 50 µm thick is laminated on the surface of the first heating layer 150, for example, as shown in FIG. 8. The metal foil layer 161*a* is closely bonded to the first heating layer 150 by vacuum hot press bonding based on vacuum lamination and pressing.

The rolled alloy exemplified as the material of the heater electrodes 151 and 161 can be used as the material of the metal foil layer 161*a*, like the metal foil layer 151*a*. That is, examples of the metal foil layer 161*a* include alloys such as CN49 (constantan) (an alloy of Cu/Ni/Mn/Fe), Zeranin (an alloy of Cu/Mn/Sn) and Manganin (an alloy of Cu/Mn/Ni). Incidentally, instead of functioning as heater electrodes generating heat, the heater electrodes 161 may function as bypass electrodes that electrically connect the heater electrodes 151 of the first heating layer 150 to each other or that electrically connect the heater electrodes 151 and the power feeding portions 163 to each other. When the heater electrodes 161 function as the bypass electrodes, a metal small in electrical resistance, such as copper or a copper alloy, may be used as the material of the metal foil layer 161*a*.

Figure 9:
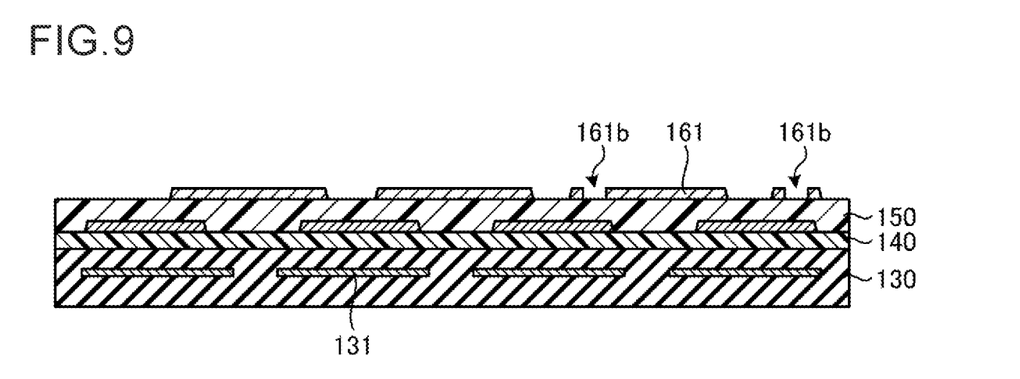
FIG. 9 is a view illustrating a specific example of a second heater pattern forming step.

Due to etching performed on the metal foil layer 161*a*, for example, using photolithography, a second heater pattern having a desired pattern is formed (step S107). That is, a resist is formed on an upper face of the metal foil layer 161*a*, and the resist is exposed to light and developed so as to form a resist pattern that covers portions to be left as the heater electrodes 161. Then, the metal foil layer 161*a* exposed without being covered with the resist pattern is removed by etching so that the heater electrodes 161 having the desired pattern are formed, for example, as shown in FIG. 9. Each of the heater electrodes 161 is disposed at a position where at least a portion of the heater electrode 161 does not overlap with a corresponding one of the heater electrodes 151. That is, the heater electrode 161 is formed at the position where, for example, the heater electrode 161 overlaps in plan view with a region where the corresponding heater electrode 151 of the first heating layer 150 is not formed. In addition, opening portions 161b are formed in the heater electrode 161 at positions where the vias 170 will be formed. The opening portions 161b are formed in the heater electrode 161 at the positions overlapping with the corresponding heater electrode 151.

Figure 10:
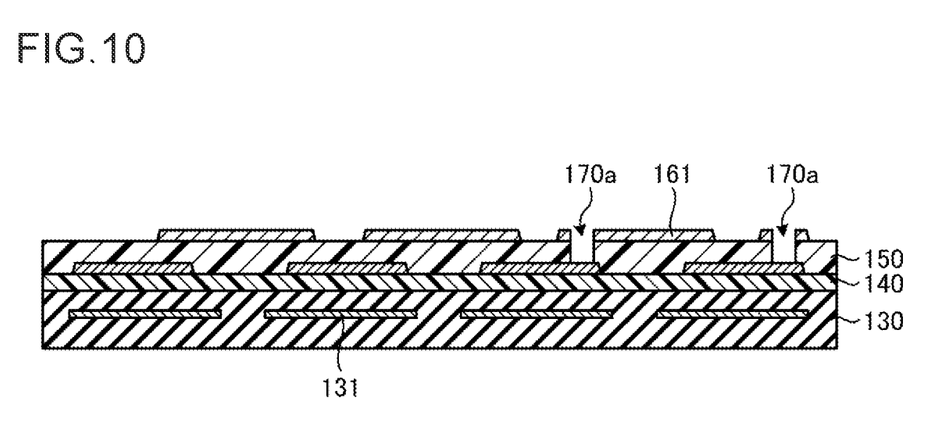
FIG. 10 is a view illustrating a specific example of a via hole forming step.

Then, via holes are formed at the positions of the opening portions 161b (step S108). Specifically, for example, as shown in FIG. 10, through holes are formed in the insulating resin 152 of the first heating layer 150 exposed in bottom faces of the opening portions 161b, for example, by laser processing to form the via holes 170a that reach each of the heater electrodes 151 of the first heating layer 150. On this occasion, the via holes 170a are formed at the positions of the opening portions 161b. Therefore, the heater electrode 161 functions as a mask for the laser processing, so that positional accuracy of the via holes 170a can be secured and a taper angle of each of the via holes 170a can be made close to 0°. The upper face of the heater electrode 151 is exposed in bottom faces of the via holes 170a. Each of the via holes 170a may have a tapered shape with a diameter decreasing as it goes from the heater electrode 161 to the heater electrode 151. On this occasion, the taper angle of the via hole 170a is desirably not more than 20° with respect to a vertical direction.

Figure 11:
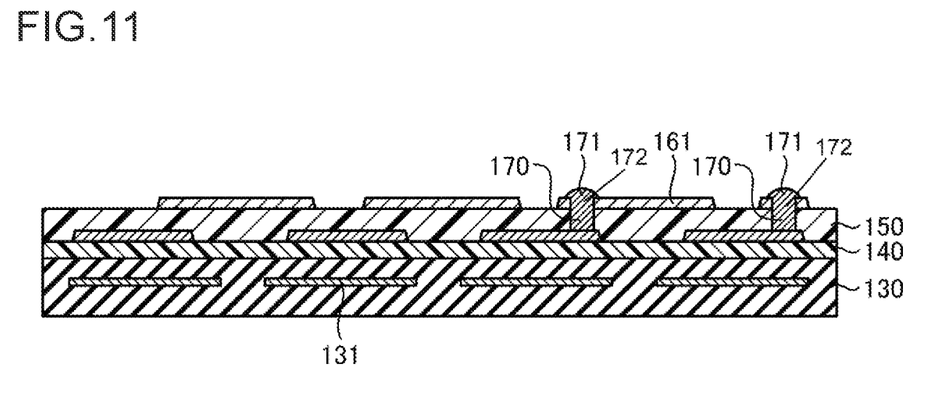
FIG. 11 is a view illustrating a specific example of a via hole filling step.

When the via holes 170a are formed, the via holes 170a are, for example, filled with a metal paste or a solder (step S109) so that the vias 170 each having a body portion 172 and an end portion 171 are formed. Specifically, for example, as shown in FIG. 11, the via holes 170a are filled with an electrically conductive member such as a silver paste in a semi-hardened state or a melted tin/silver/copper solder, and the electrically conductive member is hardened to form the vias 170. On this occasion, the end portions 171 each of which is larger in diameter than the via hole 170a are formed on an upper face of each of the heater electrodes 161. That is, the electrically conductive member in the semi-hardened state is hardened on the upper face of the heater electrode 161 in a state in which the electrically conductive member extends outward from the circumferences of the via holes 170a, so that the end portions 171 securely contacting the upper face of the heater electrode 161 are formed. As a result, connection reliability between the heater electrode 151 and the heater electrode 161 can be improved. Incidentally, a filling method of the electrically conductive member may be, for example, thick electroless plating.

Figure 12:
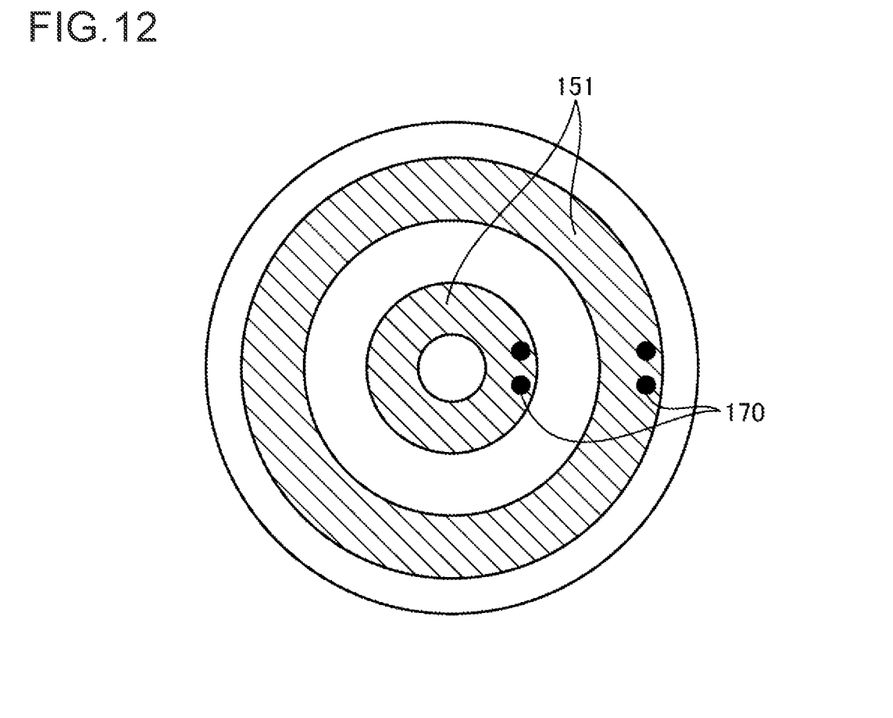
FIG. 12 is a view illustrating a specific example of the first heater pattern.
Figure 13:
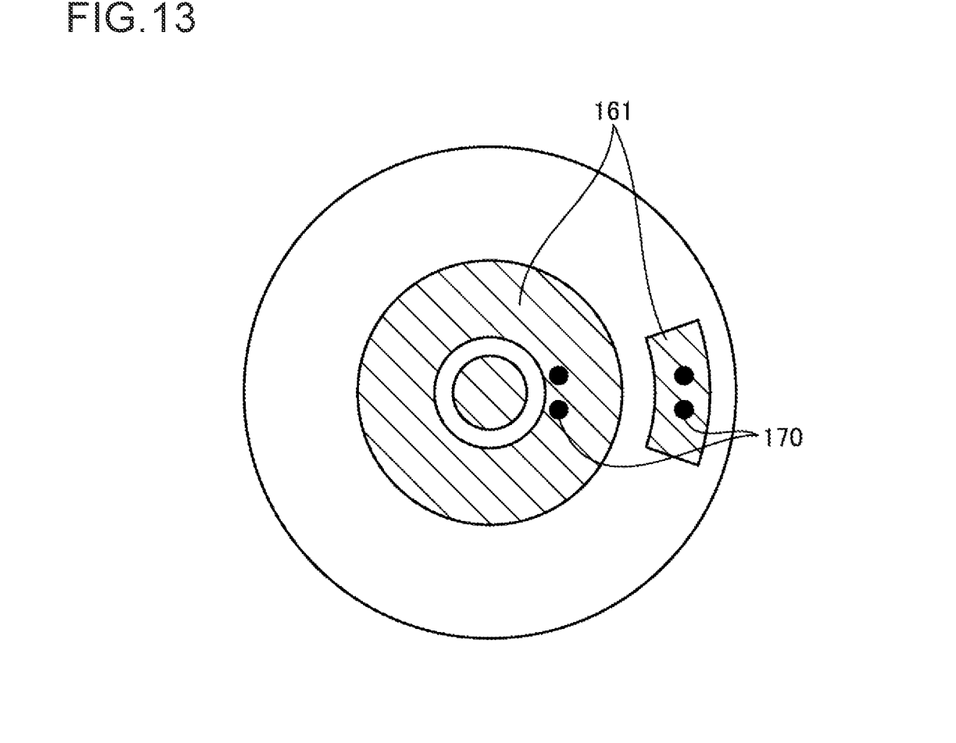
FIG. 13 is a view illustrating a specific example of the second heater pattern.

The vias 170 electrically connect the heater electrodes 151 of the first heating layer 150 and the heater electrodes 161 of the second heating layer 160 to each other. To this end, the vias 170 are formed at the positions that overlap in plan view with the heater electrodes 151 of the first heating layer 150 and overlap in plan view with the heater electrodes 161 of the second heating layer 160. When the heater electrodes 151 of the first heating layer 150 have the double concentric circle pattern, for example, as shown in FIG. 12, the vias 170 are formed at the positions that contact the heater electrodes 151 forming the concentric circle pattern respectively. Moreover, when the heater electrodes 161 of the second heating layer 160 are formed at such positions that some portions of the heater electrodes 161 overlap the heater electrodes 151 in plan view and the other portions do not overlap the heater electrodes 151, for example, as shown in FIG. 13, the vias 170 are formed at the portions overlapping the heater electrodes 151 in plan view.

Thus, the heater electrodes 151 and 161 are connected to each other through the vias 170. Accordingly, the degree of freedom for arranging the heater electrodes 151 and 161 becomes relatively high in the first heating layer 150 and the second heating layer 160. That is, for example, since the heater electrodes 161 of the second heating layer 160 are farther from the ceramic layer 130, wiring can be flexibly performed without imposing restrictions on the heater pattern of the heater electrodes 151 of the first heating layer 150. Thus, the heater pattern formed in full consideration of heat uniformity can be attained, for example, so that negative electrode side wiring can be arranged collectively or electrode pads that contact the power feeding portions 163 can be disposed in an outer circumference of the electrostatic chuck 120. As a result, a temperature distribution in plan view can be made uniform, and sufficiently high heat uniformity can be obtained.

Figure 14:
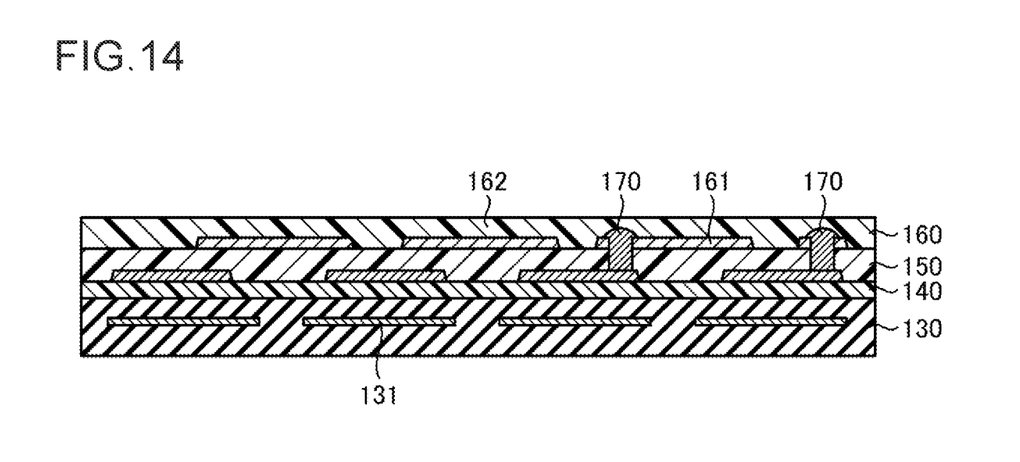
FIG. 14 is a view illustrating a specific example of another insulating resin forming step.

When the heater electrodes 151 and 161 are connected to each other through the vias 170, the insulating resin 162 is deposited to cover the heater electrodes 161 (step S110). Specifically, the insulating resin 162 in a semi-cured state is deposited so as to cover the first heating layer 150 and the heater electrodes 161, and then heated and pressed. Thus, the insulating resin 162 covering the heater electrodes 161 is cured. As a result, the second heating layer 160 deposited on the first heating layer 150 is formed, for example, as shown in FIG. 14.

Figure 15:
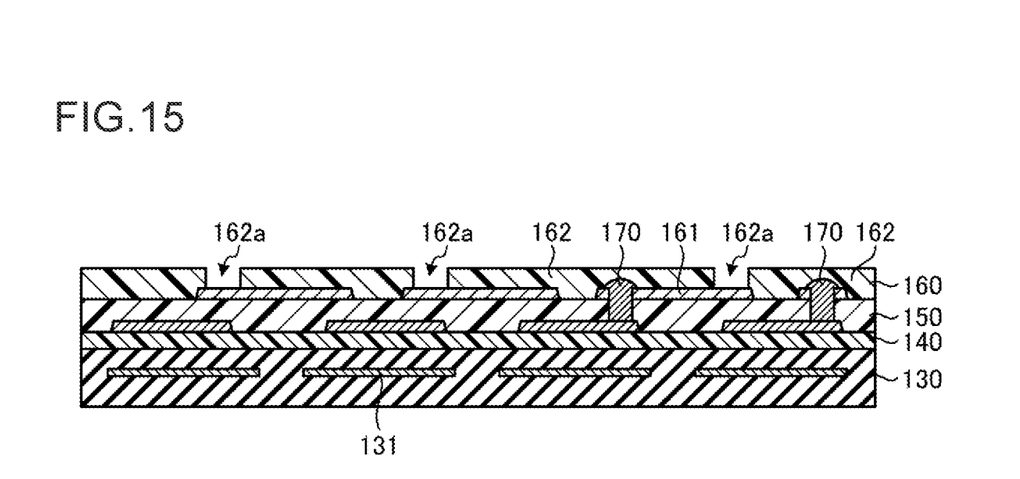
FIG. 15 is a view illustrating a specific example of an opening forming step.

Then, openings are formed in the insulating resin 162 at positions corresponding to the electrode pads of the heater electrodes 161 of the second heating layer 160 (step S111). That is, for example, as shown in FIG. 15, the openings 162a are formed in the insulating resin 162 in order to expose the heater electrodes 161 at the positions that will serve as the electrode pads contacting the power feeding portions 163. As a result, an electrostatic chuck 120 having the two layers of the heater electrodes 151 and 161 connected to each other through the vias 170 is obtained.

The electrostatic chuck 120 is adhesively bonded to the base plate 110 by an adhesive agent (step S112). Specifically, a face of the insulating resin 162 of the second heating layer 160 where the openings 162a have been formed is adhesively bonded to the base plate 110 by, for example, a silane coupling agent and an adhesive agent. On this occasion, the face of the insulating resin 162 of the second heating layer 160 is adhesively bonded to the base plate 110 after the positions of the openings 162a are aligned with the positions of the power feeding portions 163. Thus, the power feeding portions 163 and the heater electrodes 161 contact each other, so that electric power can be supplied to the heater electrodes 161. Further, since the heater electrodes 161 are connected to the heater electrodes 151 through the vias 170, the electric power can also be supplied to the heater electrodes 151. The electrostatic chuck 120 is adhesively bonded to the base plate 110. As a result, a substrate fixing device 100 is completed.

According to the present embodiment as described above, the two heater layers are provided in the electrostatic chuck, and the heater electrodes of the heater layers are connected to each other through the vias. The vias are formed by filling the via holes penetrating the insulating resin and the heater electrodes, and the end portions of the vias are larger in diameter than the via holes. Therefore, the degree of freedom for arranging the heater electrodes can be enhanced, and a heater pattern formed in consideration of heat uniformity can be attained so that sufficiently high heat uniformity can be obtained, and connection reliability between the heater electrodes of the layers through the vias can be improved.

Incidentally, although the two heater layers, i.e. the first heating layer 150 and the second heating layer 160, are provided in the electrostatic chuck 120 in the aforementioned embodiment, three or more heater layers may be alternatively provided in the electrostatic chuck 120. Even when the three or more heater layers are provided, heater electrodes of the heater layers are electrically connected to one another through vias each having the same configuration as the via 170. Thus, the degree of freedom for arranging the heater electrodes can be enhanced and the connection reliability among the heater electrodes of the heater layers can be improved.

The electrode pads are formed on the portions of the heater electrodes 151 of the first heating layer 150 that contact the vias 170 and on the portions of the heater electrodes 161 of the second heating layer 160 that contact the power feeding portions 163. Each of the electrode pads is an area having a certain diameter or more enough to establish secure connection to a corresponding one of the vias 170 or a corresponding one of the power feeding portions 163, and the circumference of the electrode pad tends to be a blank space where the heater pattern is absent. Therefore, temperature in the circumference of the electrode pad tends to decrease, which may lead to a decrease in heat uniformity.

Therefore, according to the configuration in the aforementioned embodiment, the heater pattern of one of the heating layers may overlap with the electrode pads of the other heating layer so as to prevent the decrease in the temperature in the circumferences of the electrode pads to improve the heat uniformity.

Figure 16:
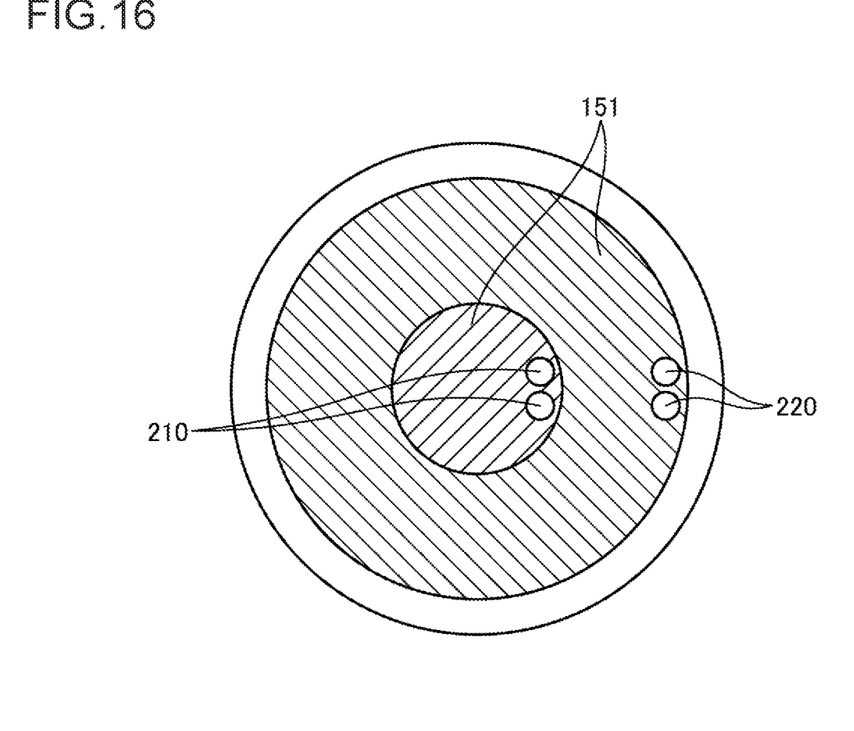
FIG. 16 is a view illustrating a specific example of the first heater pattern.
Figure 17:
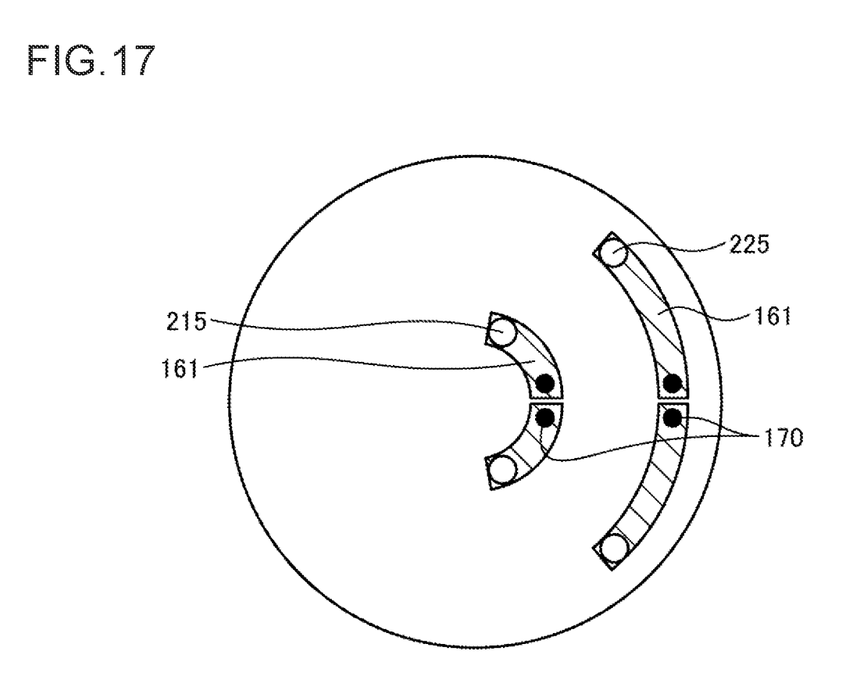
FIG. 17 is a view illustrating a specific example of the second heater pattern.

FIGS. 16 and 17 are views illustrating specific examples of positional relationships between the heater patterns and the electrode pads. FIG. 16 shows a first heater pattern formed by heater electrodes 151 of a first heating layer 150. FIG. 17 shows a second heater pattern formed by heater electrodes 161 of a second heating layer 160.

As shown in FIG. 16, the heater electrodes 151 are separated into an inner heater pattern part and an outer heater pattern part, electrode pads 210 are formed in the inner heater pattern part, and electrode pads 220 are formed in the outer heater pattern part. These electrode pads 210 and 220 contact end portions of vias 170 connecting the heater electrodes 151 and the heater electrodes 161 to each other.

That is, as shown in FIG. 17, the vias 170 are formed at positions corresponding to the electrode pads 210 and 220, and the vias 170 are surrounded by the heater electrodes 161 of the second heating layer 160. The vias 170 are smaller in diameter than the electrode pads 210 and 220, and the circumferences of the vias 170 are surrounded by the heater electrodes 161. Therefore, blank spaces where the heater pattern of the heater electrodes 151 is absent due to the electrode pads 210 and 220 are supplemented by the heater electrodes 161. In other words, a decrease in temperature in the circumferences of the electrode pads 210 and 220 of the first heating layer 150 can be also prevented by the heater electrodes 161 of the second heating layer 160.

The heater electrodes 161 of the second heating layer 160 are separated into an inner heater pattern part and an outer heater pattern part correspondingly to the heater electrodes 151 of the first heating layer 150. Electrode pads 215 are formed at positions different from the vias 170 of the inner heater pattern part, and electrode pads 225 are formed at positions different from the vias 170 of the outer heater pattern part. These electrode pads 215 and 225 contact the power feeding portions 163 that connect the heater electrodes 161 to the base plate 110.

The circumferences of the electrode pads 215 and 225 are blank spaces where the heater pattern is absent. Since the positions of the electrode pads 215 and 225 overlap with the heater electrodes 151 of the first heating layer 150, the blank spaces where the heater pattern is absent are supplemented by the heater electrodes 151. In other words, a decrease in temperature in the circumferences of the electrode pads 215 and 225 of the second heating layer 160 can be prevented by the heater electrodes 151 of the first heating layer 150.

In this manner, the heater pattern of one of the two heating layers overlaps with the electrode pads of the other heating layer. Accordingly, the blank spaces where the heater pattern is absent due to the electrode pads can be complemented, and a decrease in heat uniformity caused by a decrease in temperature in the circumferences of the electrode pads can be suppressed. In the aforementioned example, each of the heater electrodes 161 of the second heating layer 160 can be formed into any shape, and the electrode pads 215 and 225 can be flexibly arranged. Therefore, it is possible to prevent the heater electrodes 161 and the electrode pads 215 and 225 from interfering with other wiring or the like.

Various aspects of the subject matter described herein are set out non-exhaustively in the following numbered clause:

An electrostatic chuck manufacturing method comprising:

forming an adsorption layer that includes an electrode and ceramic surrounding the electrode;

forming a first heating layer on the adsorption layer, wherein the first heating layer includes a first electrode configured to generate heat, and an insulating resin covering the first electrode;

forming a second electrode on the insulating resin, wherein the second electrode has an opening portion and is configured to generate heat;

forming a via hole in the insulating resin at a position of the opening portion so as to expose a portion of the first electrode;

filling an electrically conductive material in the via hole and the opening portion so as to form a via connecting the first electrode and the second electrode to each other; and covering the via and the second electrode with an insulating resin, wherein the via comprises:

a body portion that is provided in the via hole and the opening portion; and an end portion that is connected to the body portion and formed on the second electrode, and a diameter of the end portion is larger than that of the body portion.

Although the preferred embodiments etc. have been described in detail, the concept of the disclosure is not limited to the above-described embodiments etc. and various modifications and replacements can be made in the above-described embodiments etc. without departing from the scope of the claims.

What is claimed is:

1. A substrate fixing device comprising:
a base plate; and
an electrostatic chuck that is fixed to the base plate to adsorb a substrate by electrostatic force, the electrostatic chuck comprising:
an adsorption layer that is formed of ceramic and that contacts the substrate to adsorb and hold the substrate;
a first heating layer that is formed on the adsorption layer and that includes a first electrode configured to generate heat;

a second heating layer that is formed on the first heating layer and that includes a second electrode configured to generate heat; and a via that is provided between the first electrode and the second electrode to electrically connect the first electrode and the second electrode to each other:

wherein the via comprises a body portion, and an end portion that is connected to the body portion, the body portion penetrates at least one of the first electrode and the second electrode, the end portion is formed on the at least one of the first electrode and the second electrode which the body portion penetrates, and a diameter of the end portion is larger than that of the body portion.

2. The substrate fixing device according to claim 1, wherein the adsorption layer includes an electrode to which a voltage is applied.

3. The substrate fixing device according to claim 1, wherein the first heating layer further includes an insulating resin covering the first electrode.

4. The substrate fixing device according to claim 1, wherein the second heating layer further includes an insulating resin covering the second electrode.

5. The substrate fixing device according to claim 1, wherein the via overlaps with the first electrode and the second electrode in plan view.

6. The substrate fixing device according to claim 1, wherein the base plate includes a refrigerant passage through which a refrigerant passes.

7. The substrate fixing device according to claim 1, wherein the first heating layer further includes a first electrode pad that is formed on the first electrode, and the first electrode pad overlaps with the second electrode in plan view.

8. The substrate fixing device according to claim 7, wherein the first electrode pad contacts the body portion.

9. The substrate fixing device according to claim 1, wherein the second heating layer further includes a second electrode pad that is formed on the second electrode, and the second electrode pad overlaps with the first electrode in plan view.

10. The substrate fixing device according to claim 9, wherein the second heating layer further includes a power feeding portion that electrically connects the second electrode pad and the base plate to each other.

11. An electrostatic chuck comprising:

an adsorption layer that is formed of ceramic and that adsorbs and holds a substrate by electrostatic force;

a first heating layer that is formed on the adsorption layer and that includes a first electrode configured to generate heat;

a second heating layer that is formed on the first heating layer and that includes a second electrode configured to generate heat; and a via that is provided between the first electrode and the second electrode to electrically connect the first electrode and the second electrode to each other, wherein the via comprises a body portion, and an end portion that is connected to the body portion, the body portion penetrates at least one of the first electrode and the second electrode, the end portion contacts the at least one of the first electrode and the second electrode which the body portion penetrates, and a diameter of the end portion is larger than that of the body portion.

* * * * *